United States Patent [19]

Corcelle et al.

[11] 4,236,058
[45] Nov. 25, 1980

[54] REGULATION OF ELECTRON-BEAM WELDING GENERATORS

[75] Inventors: François Corcelle, Thoiry; Jean-Pierre Hamon, Cergy; Philippe Martin, Orsay, all of France

[73] Assignee: L'Air Liquide, Societe Anonyme pour l'Etude et l'Exploitation des Procedes Georges Claude, Paris, France

[21] Appl. No.: 925,874

[22] Filed: Jul. 18, 1978

[30] Foreign Application Priority Data

Jul. 22, 1977 [FR] France .................. 77 22599

[51] Int. Cl.³ .................. B23K 15/00; G05F 1/10
[52] U.S. Cl. .................. 219/121 EA; 219/121 EC; 315/307
[58] Field of Search ............. 219/121 EB, 121 EM, 219/121 EA, 121 EC, 121 ED; 315/107, 297, 307

[56] References Cited

U.S. PATENT DOCUMENTS

| | | | |
|---|---|---|---|
| 3,760,279 | 9/1973 | Rudolph | 219/121 EB X |
| 3,838,313 | 9/1974 | Anderson | 219/121 EB X |
| 3,875,366 | 4/1975 | Von Walter | 219/121 EM |
| 3,999,032 | 12/1976 | Mayer | 219/121 EB |
| 4,045,707 | 8/1977 | Gernot et al. | 219/121 EB X |

OTHER PUBLICATIONS

*Automatic Welding,* vol. 22, No. 2, Feb. 1969, pp. 58–62, "A New 13.5 kW Electron Beam Welding Apparatus" by Nazarenko et al.

*Primary Examiner*—B. A. Reynolds
*Assistant Examiner*—Keith E. George
*Attorney, Agent, or Firm*—Lee C. Robinson, Jr.

[57] ABSTRACT

A method of and apparatus for regulating an electron-beam welding generator of the kind having three electrodes viz: a cathode, a Wehnelt electrode and an anode. The method is characterized by a suitable combination of two methods of regulating an electron beam welding gun. One of these methods includes varying and regulating the very high voltage while maintaining the voltage applied to the Wehnelt electrode at the potential of the cathode (operation of the "diode" kind). The other method includes holding the very high voltage constant while regulating or programming the welding current by means of the voltage to the Wehnelt electrode (operation of the "triode" kind). The variations in and regulation of the very high voltage are controlled by an induction regulator associated with a thyristorized regulator.

11 Claims, 2 Drawing Figures

REGULATION OF ELECTRON-BEAM WELDING GENERATORS

BACKGROUND OF THE INVENTION

The present invention relates to methods of and apparatus for regulating electron-beam welding generators of the kind having three electrodes, viz: a cathode, a Wehnelt electrode and an anode.

In certain types of electron-beam welding, in particular when welding circular parts, to eliminate the defects caused by sudden rises and falls in power it is found necessary to bring about a gradual rise in power followed by a period in which power is substantially constant (or variable to suit the configuration of the part), and then a gradual drop in power at the end of the welding operation.

In the case of high speed welding operations, or in the case of the production of parts which are difficult to weld, it has proved necessary, in order to achieve the minimum number of rejects, to regulate the principal welding parameters, namely the high accelerating voltage, the welding current put out by the gun, and the current to the magnetic focussing lens to values which are as constant as possible.

This regulation of welding power is generally carried out by one or other of the following two methods: on the one hand, only the value of the high voltage may be varied, which results in a corresponding variation in the welding current and thus in the power put out by the electron gun. This is what is called operation in the "diode" mode, On the other hand, only the electron welding current emitted by the gun may be varied while holding the high voltage constant, by biasing the Wehnelt tube to be negative with respect to the cathode to a greater or lesser degree. This is called operation in the "triode" mode.

Both of these methods have their respective advantages and disadvantages.

The principal advantage of operation in the "diode" mode lies in the fact that the point of electrostatic concentration or "crossover" point of the electron beam remains substantially unaltered during regulation, and if it is located where the passage through the anode is situated, this passage can be made as narrow as possible. This results in a considerable increase in the pressure difference between the inter-electrode space and the remainder of the gun, thus enabling a high vacuum of the order of $10^{-5}$ Torr to be maintained in the inter-electrode space, which is particularly sensitive by reason of the danger of arcing. The remainder of the electron gun, that is to say the zone where the electromagnetic lens is situated, and even the welding chamber, may be maintained at a lower vacuum, termed a primary vacuum, of the order of $10^{-3}$ to $10^{-2}$ Torr.

The principal disadvantage of operation in the "diode" mode is that power may vary substantially not only as a function of variations in the high voltage but also as a function of the perveance of the gun, the perveance being in particular a function of dimensional variations of thermal origin in certain parts of the electron gun and also of the aging of the cathode. To compensate for these variations in power it is therefore necessary to regulate the high voltage, which results in relatively complicated arrangements which are unsuitable for use where the operations of modulating the power take place at a high frequency, as is often required in electron-beam welding operations.

On the other hand, operation in the "triode" mode enables the easy regulation of the welding current simply by altering the bias of the Wehnelt electrode, thus giving a welding power which is regulated to a value which may be constant. However, the considerable variations in the bias of the Wehnelt electrode are accompanied by a shift in the point of electrostatic focus and an increase in the angular width of the electron beam. Accordingly, to prevent the anode from heating up excessively, it is necessary to increase its conductance substantially, or in other words to increase the diameter of the passage through it, which has a particularly adverse effect on maintaining a high vacuum in the inter-electrode space.

It is an object of the invention to alleviate these disadvantages by using a suitable combination of both these methods of regulation which in all cases allows mainly their advantages to come into play without the disadvantages which have been mentioned being thereby incurred.

SUMMARY OF THE INVENTION

In accordance with the invention, in the course of a welding operation which comprises an initial phase involving a progressive rise in power, an operating phase at steady power, and a terminal phase involving a drop in power, provision is made to employ the following measures in combination:

(a) the initial phase comprises a first phase in which power is raised by a simultaneous increase in the accelerating voltage and in the welding current from levels of zero, while maintaining the Wehnelt electrode at all times at the potential of the cathode. This first phase is followed by a second phase in the course of which the accelerating voltage continues to increase progressively to its steady voltage while the Wehnelt electrode is progressively negatively biased with respect to the cathode in order to hold the welding current substantially constant, (b) the operating phase, in which a substantially steady level is maintained, is achieved by holding the acceleration voltage substantially constant while regulating the power within narrow limits, between a maximum power and a minimum power which is 15% less than the maximum power, by varying the welding current. This is achieved solely by varying the potential of the Wehnelt electrode, (c) the terminal phase involving a progressive drop in power comprises a first phase in which a drop is achieved by a progressive reduction in the accelerating voltage while holding the current substantially constant, by progressively reducing the bias of the Wehnelt electrode to the potential of the cathode, and a second power-drop phase which is achieved by reducing the accelerating voltage and the welding current to values of zero.

In accordance with another advantageous feature of the invention, the changes in the acceleration voltage are achieved by means of a regulator of the induction type which supplies a thyristorised regulator, and the output voltage from the said induction regulator is adjusted to be higher than the output voltage from the thyristorised regulator.

In this way, the major part of the power rise or power drop is achieved solely by increasing the accelerating voltage, and thus in the "diode" mode. With this arrangement the electron beam does in fact remain focused on the anode passage with the smallest possible angular width. The variations in the acceleration voltage and/or the current in the steady state are achieved by easily performed changes in the bias of the Wehnelt electrode, and thus in the "triode" mode, and since these changes are confined within narrow limits, there is no danger of their causing major shifts in the point of electrostatic convergence of the beam, with the result that the anode passage can in practise remain of the small size suitable for the "diode" mode.

BRIEF DESCRIPTION OF THE DRAWINGS

In order that this invention may be more easily understood, reference will now be made to the accompanying drawings, which show one particular embodiment thereof by way of example and in which.

DETAILED DESCRIPTION OF PREFERRED EMBODIMENT

Figure 1:
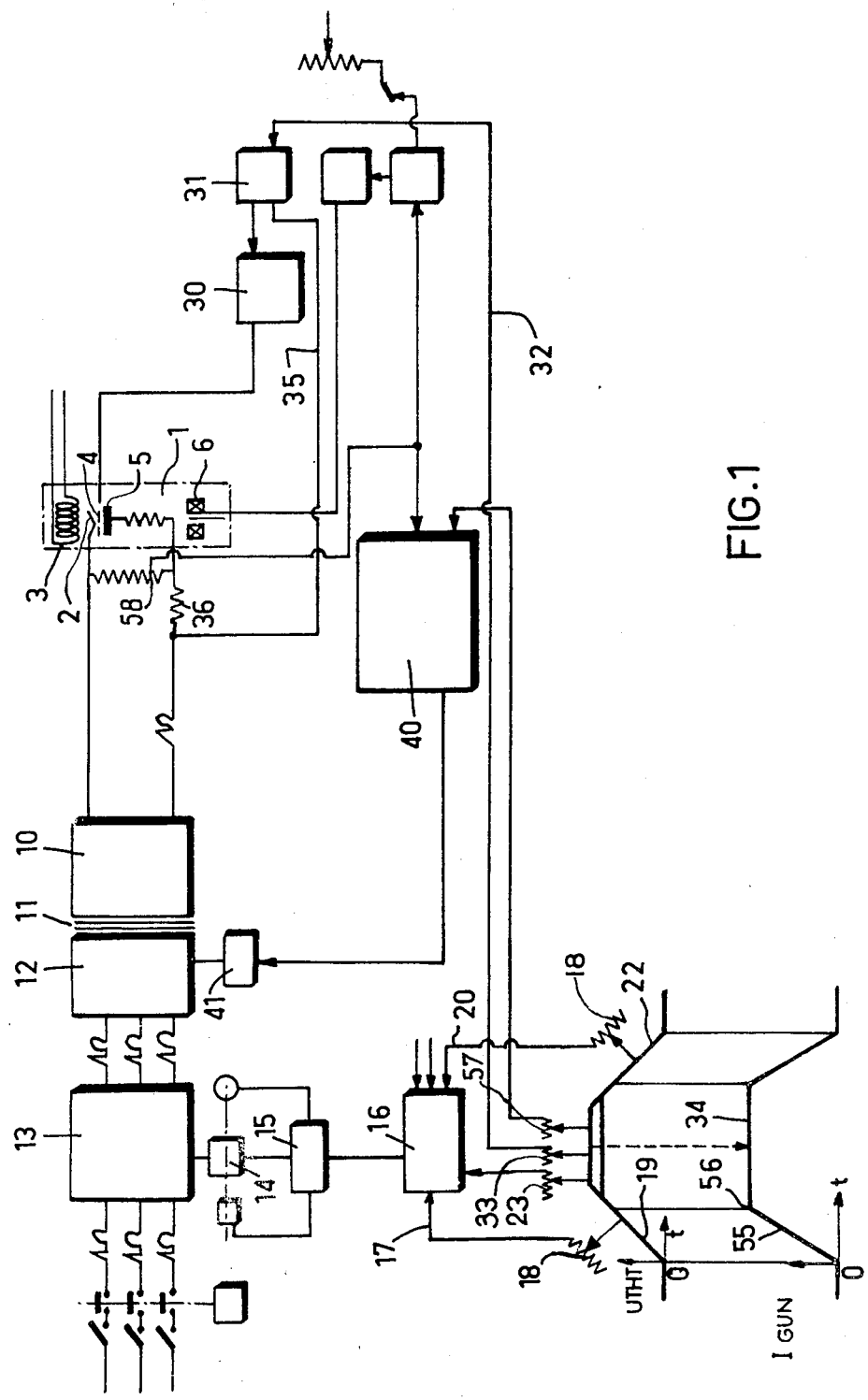
FIG. 1 is schematic view of an apparatus for carrying out the invention.

Referring now to the drawings, FIG. 1 shows an electron gun 1 which comprises in essence a cathode 2 heated by a filament 3, a Wehnelt electrode 4 and an anode 5, as well as an electromagnetic focussing coil 6. The cathode 2 and the anode 5 are connected to the terminals of a circuit which incorporates, reading in the downstream direction, a secondary winding of a transformer 11 and a rectifier bridge and a filtering means, which are represented in the Figure by member 10. Unit 12 represents the primary winding of the transformer 11 and the associated set of thyristors, which in turn are fed by an induction regulator 13. The induction regulator 13 includes in conventional fashion a rotating part which can be set in motion by a motor 14, which latter is supplied by an amplifier 15 under the control of a control device 16 having a plurality of inputs. One of these inputs 17 incorporates a potentiometer 18 for regulating the gradient of the voltage rise to follow a slope 19, while another input 20 incorporates a potentiometer 21 for regulating the gradient 22 of the drop in the high voltage. A third input 23 holds the maximum voltage from the output of the induction regulator at the level indicated at 24.

The Wehnelt electrode 4 is connected to a power supply 30. The device 31 is controlled by a servoing device 31 which compares, on the one hand, via a circuit 32 containing a potentiometer 33, a reference voltage corresponding to a maximum current as indicated at 34, and on the other hand a voltage at a conductor 35 connected to one terminal of a resistor 36 through which the welding current flows, the other terminal of resistor 36 being connected to ground at 37.

The unit 40 includes a device which performs a comparison between the value of the very high voltage set by a potentiometer 57 and the value at all times measured by a divider bridge 58, and which controls the triggers 41 for the thyristors.

Figure 2:
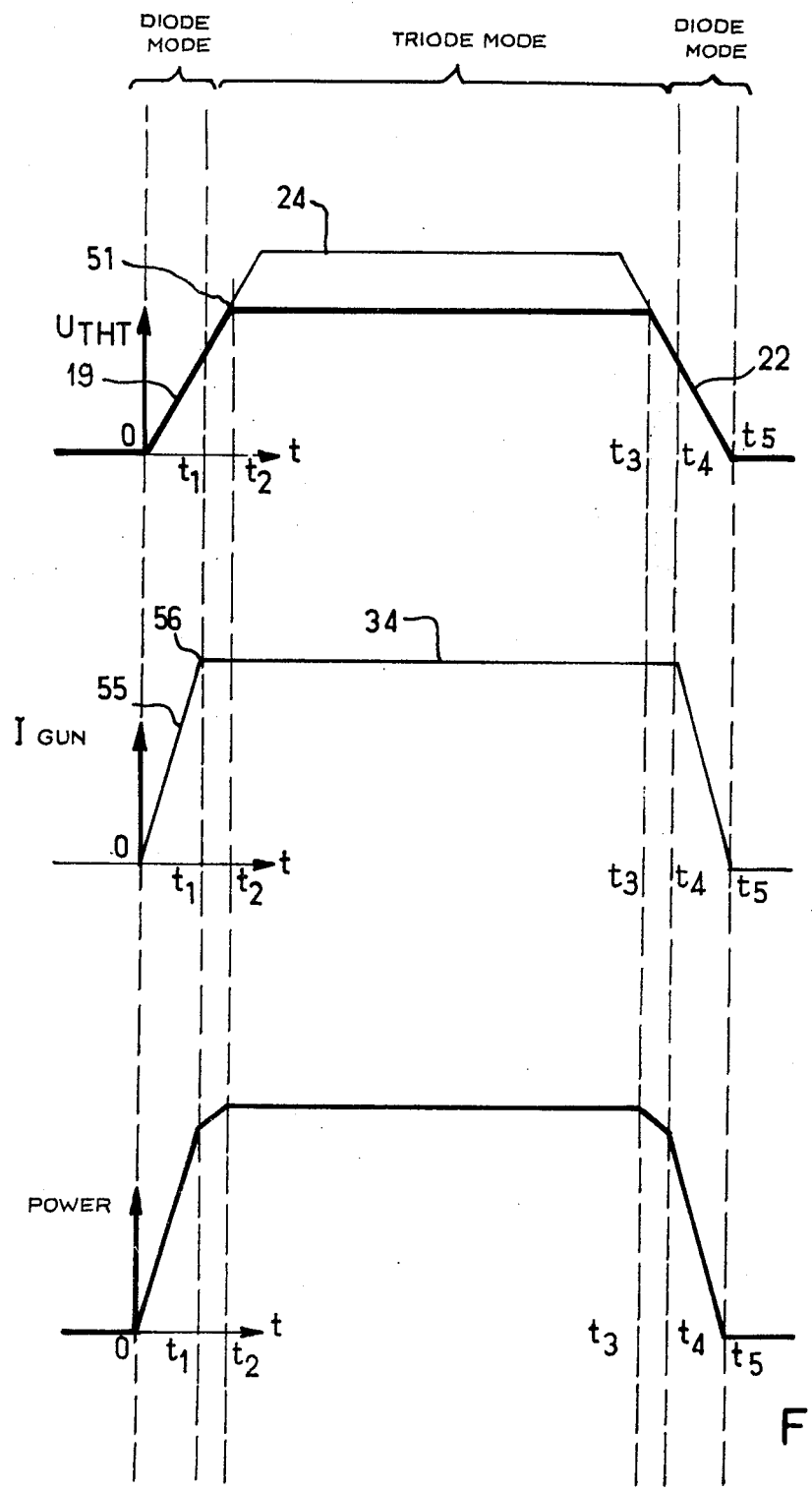
FIG. 2 is a diagram of the accelerating voltage, the welding current and the power supplied by the gun, as a function of time.

The way in which the apparatus described operates is as follows: starting from a situation in which the acceleration voltage and welding current are zero (reference will also be made to FIG. 2):

(a) In a first stage, the acceleration voltage U THT increases gradually by rotation of motor 14 as indicated at 19 from a value of zero to 51, which represents the level of the output voltage from the thyristors. During this phase of voltage rise, the gun current I, starting from a value of zero, increases progressively as indicated at 55 to a point 56. Point 56 lies at a time t1, which is in advance of a time t2 which corresponds to point 51 on the acceleration voltage. During the period 0–t1, the power to the gun increases linearly with a sharp rise, while in the period t1–t2 the power continues to increase, but less sharply since the current is held at a contant level after time t1. During the whole of the period t0 to t1, the operation of the gun is of the "diode" type. What this means in the layout shown in FIG. 1 is that the motor 14 is set turning under the prompting of the control device 16 and follows the gradient of voltage increase 19 which is set by potentiometer 18. During the whole of the period 0–t1, the Wehnelt electrode 4 is fed by the power supply in such a way as to be held strictly at the same potential as the cathode 2.

After time t1, the device 30 for supplying the Wehnelt electrode 4 begins to bias the Wehnelt electrode negatively under the prompting of the servo-control device 31. The device 31 compares the current measured via the conductor 35 with the value set for this current by the slope 55 as determined by potentiometer 33, which is transmitted by circuit 32, this value being held constant at level 34 from point 56 (time t1) to point t4. This is operation of the "triode" type.

(b) From time t2, the value of the high voltage remains constant by virtue of the thyristorised regulation, whereas the induction regulator continues to operate until such time as the output voltage 24 is, as a function of the voltage, 5 to 15% higher than the voltage required from the output of the thyristorised regulator.

If, for various reasons such as dimensional changes of thermal origin or aging of the cathode, the welding current I tends to vary somewhat from the set value, this variation is compensated for by a variation in the potential of the Wehnelt electrode 4, which is achieved by a comparison between the value indicated by circuit 32 and the value measured by circuit 35. However, such variations are held within narrow limits and in any case never exceed 15% of the values previously determined.

(c) When the welding operation comes to an end, the motor 14 begins to turn in the opposite direction to reduce the voltage at the output of the regulator 13 under the prompting of device 16, which is itself slaved to the dropping potentiometer 21.

During the first phase t3–t4, the current is still held constant by a progressive removal of the bias on the Wehnelt electrode 4 and the voltage drop is of moderate steepness, while in the following phase t4–t5 not only does the acceleration voltage continue to drop but the welding current also begins to fall under the prompting of the control device 31 which is slaved to potentiometer 33. This is in fact exactly the reverse of the process which occured during period 0–t2.

It will be recalled that during the period 0–t1 and during the period t4–t5, the voltage of the Wehnelt electrode is held constant and equal to that of the cathode 2, so that operation is in the "diode" mode.

In periods t2-t3, in which the acceleration voltage is held constant and regulation depends upon the potential of the Wehnelt electrode, operation is thus in a purely "triode" mode.

In the periods t1-t2 and t3-t4, a "triode" mode phase also exists since the potential of the Wehnelt electrode is altered with respect to the potential of the cathode, but in addition a mode of the "diode" type is superimposed on the first mode by altering the acceleration voltage.

The invention is applicable to electron-beam welding operations which include a progressive rise and fall in the welding power.

We claim:

1. In a method of regulating an electron-beam welding generator of the kind having three electrodes: a cathode, a Wehnelt electrode and an anode, in which method the accelerating voltage between the cathode and anode and the biasing voltage to the Wehnelt electrode are acted on to enable a welding operation to be performed which comprises an initial phase involving a progressive rise in power, an operating phase in which power is substantially steady, and a terminal phase involving a progressive drop in power, the invention in which said phases are conducted as follows:
   (a) the initial phase comprises a first phase in which power is raised by a simultaneous increase in the accelerating voltage and in the welding circuit from values of zero, while said Wehnelt electrode is held at the potential of said cathode, said first phase being followed by a second phase during which the accelerating voltage is caused to continue to increase progressively to its steady voltage while said Wehnelt electrode is progressively negatively biased with respect to said cathode in order to hold the welding current substantially constant,
   (b) an operating phase, in which a substantially steady level is maintained, is achieved by holding the accelerating voltage substantially constant while applying regulation within narrow limits, between a maximum power and a minimum power which is 15% less than said maximum power, and by varying the welding current, which is achieved solely by varying the potential of said Wehnelt electrode, and
   (c) the terminal phase involving a progressive drop in power, comprises a first phase in which power drops as a result of progressive reduction in the accelerating voltage while maintaining the current substantially constant, by a progressive reduction in the bias of the Wehnelt electrode to the potential of the cathode, and a second power-drop phase which is achieved by reducing the accelerating voltage to a value to zero.

2. A method of regulating an electron-beam welding generator, according to claim 1, wherein said changes in the accelerating voltage are brought about by a regulator of the induction type which supplies a thyristorised regulator, and the output voltage from said induction regulator is adjusted to be higher than the output voltage from said thyristorised regulator.

3. In a method of regulating an electron-beam welding generator having an electron discharge device including a cathode, a Wehnelt electrode and an anode, the steps of:
   increasing the power of the generator to an operating level by first increasing the power while maintaining the Wehnelt electrode at the potential of the cathode, and thereafter continuing to increase the power while biasing the Wehnelt electrode progressively negative with respect to the cathode to hold the welding current substantially constant;
   maintaining the power within substantially constant limits at the operating level; and
   thereafter decreasing the power by decreasing the voltage between the cathode and the anode.

4. In a method of regulating an electron-beam welding generator having an electron discharge device including a cathode, a Wehnelt electrode and an anode, the steps of:
   increasing the power of the generator to an operating level by first increasing the welding current and the voltage between the cathode and the anode while maintaining the Wehnelt electrode at the potential of the cathode, and thereafter continuing to increase the voltage between the cathode and the anode while biasing the Wehnelt electrode progressively negative with respect to the cathode to hold the welding current substantially constant;
   maintaining the power within substantially constant limits at the operating level; and
   thereafter decreasing the power by decreasing the voltage between the cathode and the anode.

5. In a method of regulating an electron-beam welding generator having an electron discharge device including a cathode, a Wehnelt electrode and an anode, the steps of:
   increasing the power of the generator to an operating level by first increasing the welding current and the voltage between the cathode and the anode while maintaining the Wehnelt electrode at the potential of the cathode, and thereafter continuing to increase the voltage between the cathode and the anode while biasing the Wehnelt electrode progressively negative with respect to the cathode to hold the welding current substantially constant;
   maintaining the power within substantially constant limits at the operating level;
   regulating the power within said limits by holding the voltage between the cathode and the anode substantially constant and varying the potential of the Wehnelt electrode to thereby vary the welding current; and
   thereafter decreasing the power by decreasing the voltage between the cathode and the anode.

6. In a method as defined in claim 5, in which the substantially constant limits within which the power is maintained at the operating level comprise a maximum power and a minimum power which is 15% less than the maximum power.

7. In a method of regulating an electron-beam welding generator having an electron discharge device including a cathode, a Wehnelt electrode and an anode, the steps of:
   increasing the power of the generator to an operating level by first simultaneously increasing the welding current and the voltage between the cathode and the anode while maintaining the Wehnelt electrode at the potential of the cathode, and thereafter continuing to increase the voltage between the cathode and the anode while biasing the Wehnelt electrode progressively negative with respect to the cathode to hold the welding current substantially constant;
   maintaining the power within substantially constant limits at the operating level;
   regulating the power within said limits by holding the voltage between the cathode and the anode substantially constant and varying the potential of the Wehnelt electrode to thereby vary the welding current; and decreasing the power by first decreasing the voltage between the cathode and the anode while progressively reducing the bias of the Wehnelt electrode to hold the welding current substantially constant, and thereafter decreasing the voltage between the cathode and the anode to a value of zero.

8. In apparatus for regulating an electron-beam welding generator having means for supplying power to the generator and an electron discharge device including a cathode, a Wehnelt electrode and an anode, in combination:

an induction regulator electrically connected to the power supply means;

first control means connected to the induction regulator for controlling the same to increase the power of the generator to an operating level, the first control means including means operable during an initial portion of the increase in power for increasing the welding current and the voltage between the cathode and the anode, while maintaining the Wenhelt electrode at the potential of the cathode, and including means operable during a subsequent portion of the increase in power for continuing to increase the voltage between the cathode and the anode while biasing the Wehnelt electrode progressively negative with respect to the cathode to hold the welding current substantially constant;

servo means connected to the Wehnelt electrode for maintaining the power within substantially constant limits at the operating level; and second control means connected to the induction regulator for controlling the same to decrease the power of the generator from the operating level.

9. In apparatus for regulating an electron-beam welding generator having means for supplying power to the generator and an electron discharge device including a cathode, a Wehnelt electrode and an anode, in combination:

an induction regulator electrically connected to the power supply means;

first control means connected to the induction regulator for controlling the same to increase the power of the generator to an operating level, the first control means including means operable during an initial portion of the increase in power for increasing the welding current and the voltage between the cathode and the anode while maintaining the Wehnelt electrode at the potential of the cathode, and including means operable during a subsequent portion of the increase in power for continuing to increase the voltage between the cathode and the anode while biasing the Wehnelt electrode progressively negative with respect to the cathode to hold the welding current substantially constant;

servo means connected to the Wehnelt electrode for maintaining the power within substantially constant limits at the operating level by holding the voltage between the cathode and the anode substantially constant and varying the potential of the Wehnelt electrode to thereby vary the welding current; and second control means connected to the induction regulator for controlling the same to decrease the power of the generator from the operating level.

10. In apparatus for regulating an electron-beam welding generator having means for supplying power to the generator and an electron discharge device including a cathode, a Wehnelt electrode and an anode, in combination:

an induction regulator electrically connected to the power supply means;

first control means connected to the induction regulator for controlling the same to increase the power of the generator to an operating level, the first control means including means operable during an initial portion of the increase in power for increasing the welding current and the voltage between the cathode and the anode while maintaining the Wehnelt electrode at the potential of the cathode, and including means operable during a subsequent portion of the increase in power for continuing to increase the voltage between the cathode and the anode while biasing the Wehnelt electrode progressively negative with respect to the cathode to hold the welding current substantially constant;

servo means connected to the Wehnelt electrode for maintaining the power within substantially constant limits at the operating level by holding the voltage between the cathode and the anode substantially constant and varying the potential of the Wehnelt electrode to thereby vary the welding current; and second control means connected to the induction regulator for controlling the same to decrease the power of the generator from the operating level, the second control means including means operable during an initial portion of the decrease in power for decreasing the voltage between the cathode and the anode while progressively reducing the bias of the Wehnelt electrode to hold the welding current substantially constant, and including means operable during a subsequent portion of the decrease in power for decreasing the voltage between the cathode and the anode to a value of zero.

11. In apparatus for regulating an electron-beam welding generator having means for supplying power to the generator and an electron discharge device including a cathode, a Wehnelt electrode and an anode, in combination:

an induction regulator electrically connected to the power supply means;

first control means connected to the induction regulator for controlling the same to increase the power of the generator to an operating level at a given adjustable rate, the first control means including means operable during an initial portion of the increase in power for simultaneously increasing the welding current and the voltage between the cathode and the anode while maintaining the Wehnelt electrode at the potential of the cathode, and including means operable during a subsequent portion of the increase in power for continuing to increase the voltage between the cathode and the anode while biasing the Wehnelt electrode progressively negative with respect to the cathode to hold the welding current substantially constant;

servo means connected to the Wehnelt electrode for maintaining the power within substantially constant limits at the operating level by varying the potential of the Wehnelt electrode; and second control means connected to the induction regulator for controlling the same to decrease the power of the generator from the operating level at a given adjustable rate, the second control means including means operable during an initial portion of the decrease in power for decreasing the voltage between the cathode and the anode while progressively reducing the bias of the Wehnelt electrode to hold the welding current substantially constant, and including means operable during a subsequent portion of the decrease in power for simultaneously decreasing the welding current and the voltage between the cathode and the anode.

* * * * *